United States Patent [19]

Akiyama et al.

[11] Patent Number: 5,180,992
[45] Date of Patent: Jan. 19, 1993

[54] PLL FREQUENCY SYNTHESIZER HAVING A POWER SAVING CIRCUIT

[75] Inventors: Takehiro Akiyama; Kazumi Ogawa, both of Kasugai, Japan

[73] Assignee: Fujitsu Limited, Japan

[21] Appl. No.: 777,927

[22] Filed: Oct. 17, 1991

[30] Foreign Application Priority Data

Oct. 18, 1990 [JP] Japan .................. 2-279814

[51] Int. Cl.⁵ ........................... H03L 7/00
[52] U.S. Cl. ........................... 331/11; 331/25; 331/186
[58] Field of Search .............. 331/1 A, 10, 11, 14, 331/25, 186; 455/76, 95, 127, 183, 260, 343

[56] References Cited

U.S. PATENT DOCUMENTS 4,631,496 12/1986 Borras et al. ............. 331/25 X

FOREIGN PATENT DOCUMENTS 64-34017 2/1989 Japan .
1-215123 8/1989 Japan .

Primary Examiner—Robert J. Pascal

[57] ABSTRACT

A PLL frequency synthesizer includes a reset circuit which determines whether or not an oscillator starts to normally generate an oscillation signal in response to a power save signal which intermittently operates the oscillator in a standby mode and which outputs a reset signal to a prescaler when it is determined that the oscillator normally generates the oscillation signal. A hold circuit prevents a frequency-divided signal being output from the prescaler to a programmable counter and an initial phase detection circuit until the prescaler is reset to an initial state in response to the reset signal and starts to normally generate the frequency-divided signal.

7 Claims, 8 Drawing Sheets

PLL FREQUENCY SYNTHESIZER HAVING A POWER SAVING CIRCUIT

BACKGROUND OF THE INVENTION (1) Field of the Invention

The present invention generally relates to PLL frequency synthesizers, and more particularly to a PLL frequency synthesizer having an improved circuit arrangement for reducing power consumed in the PLL frequency synthesizer.

(2) Description of the Prior Art

Recently, PLL (Phase-Locked Loop) frequency synthesizers have been used in various mobile communication devices, such as portable telephone sets and cordless telephone sets. It is desired that such mobile communication devices are compact and light, and particularly consume a small amount of energy. In general, mobile communications devices utilize PLL frequency synthesizers. In order to satisfy the above-mentioned requirements, it is required that the PLL frequency synthesizers consume a small amount of energy.

The mobile communication device has a communication mode and a standby mode. In general, the mobile communication device is maintained in the standby mode for a long time. In the standby mode, the mobile communication device does not communicate with the other communication device except that a control communication is executed between the mobile communication device and a control office at predetermined intervals. If electricity is continuously supplied to the mobile communication device in the standby mode, electricity is consumed wastefully. With this in mind, electricity is intermittently supplied to the mobile communication device at predetermined intervals as necessary to execute the control communications. With this arrangement, it is possible to save a considerable amount of energy. In order to execute power supply intermittently, it is necessary to operate the PLL frequency synthesizer intermittently.

FIG. 1 is a block diagram of a conventional PLL frequency synthesizer. As shown, the PLL frequency synthesizer is composed of a crystal oscillator circuit 1, a reference counter 2, a prescaler 3, a programmable counter 4, a phase comparator 5, a lowpass filter (LPF) 6, and a voltage-controlled oscillator (VCO) 7. A PLL circuit 8 is composed of the crystal oscillator circuit 1, the reference counter 2, the prescaler 3, the programmable counter 4 and the phase comparator 5.

As shown in FIG. 2, a switch 9 is provided between a power source Vcc, such as a battery, and the PLL circuit 8. The switch 9 is controlled by a power save signal PS, which has, for example, a high level in the communication mode, and a low level in the standby mode. The level of the power save signal PS periodically changes. Thereby, electricity from the power source Vcc is intermittently supplied to the PLL circuit 8.

However, it is difficult to establish correct and definite operation of the PLL frequency synthesizer. In order to improve the operation of the PLL frequency synthesizer, it may be possible to use a circuit configuration shown in FIG. 3. The power save signal PS is input to the crystal oscillator circuit 1, the prescaler 3 and the voltage-controlled oscillator 7. The crystal oscillator 1 stops oscillating in the standby mode in response to the power save signal PS. The prescaler 3 does not transfer the signal from the voltage-controlled oscillator 7 to the programmable counter 4 in the standby mode. An initial phase detection circuit 10 and a buffer 11 are added to the configuration shown in FIG. 1, as shown in FIG. 3.

The initial phase detection circuit 10 inputs the signal from the prescaler 3 and the signal from the crystal oscillator circuit 1 via the buffer circuit in response to the high level of the power save signal PS. When the difference between the rise timing of the signal from the prescaler 3 and the rise timing of the signal from the crystal oscillator circuit 1 falls within a predetermined range, the initial phase detection circuit 10 generates an in-phase detection signal, which is input to the counters 2 and 4, and the phase comparator 5. The counters 2 and 4, and the phase comparator 5 do not receive the respective input signals until the power save signal PS switches to the high level from the low level and the in-phase detection signal is received.

When the power save signal PS has the low level, the crystal oscillator circuit 1 does not execute the oscillation operation, and the prescaler 3 is switched to a no-signal state where the prescaler 3 cuts off the signal from the voltage-controlled oscillator 7. Hence, the reference counter 2 and the programmable counter 4 do not receive any signal although they receive electricity. In general, the prescaler 3 is composed of CMOS (Complementary Metal Oxide Semiconductor) transistors. Thus, energy is not consumed in the prescaler 3 in the no-signal state. Since each of the reference counter 2 and the programmable counter 4 is also composed of CMOS transistors, they do not consume energy in the no-signal state. In addition, data in the counters 2 and 4 is maintained without being destroyed since they are supplied with electricity.

The phase comparator 5 is composed of CMOS transistors, and receives signals from the counters 2 and 4 indicating that the frequency is zero in the no-signal state. In this state, the phase comparator 5 does not consume energy. Further, the phase comparator 5 is maintained in a high-impedance state when the power save signal PS has the low level. The oscillation frequency of the voltage-controlled oscillator 7 does not deviate from a previously locked frequency when the power supply to the phase comparator 5 which is in the high-impedance state is stopped for a very short time, because a control voltage applied to the voltage-controlled oscillator 7 and obtained before the power save signal PS switches to the low level is maintained in the lowpass filter 6. When the power save signal PS switches from the low level to the high level, the crystal oscillator circuit 1 starts to oscillate, and the signal from the voltage-controlled oscillator 7 is input to the prescaler 3. At this time, the output signals of the crystal oscillator circuit 1 and the prescaler 3 are input to the counters 2 and 4, respectively, while the in-phase detection signal has not yet been input to the counters 2 and 4. Hence, the counters 2 and 4 and the phase comparator 5 do not start to operate at this time.

When the initial phase detection circuit 10 detects the in-phase state where the difference between the rise timings of the signals from the crystal oscillator circuit 1 and the prescaler 3 falls within the predetermined range, the in-phase detection signal is applied to the counters 2 and 4 and the phase comparator 5. In response to the in-phase detection signal, the counters 2 and 4 and the phase comparator 5 receive the respective input signals and start to operate.

With the above-mentioned arrangement, it becomes possible to reduce energy consumed in the PLL frequency circuit and to start to operate the PLL frequency circuit after the phase is locked.

The prescaler 3 composed of CMOS transistors is capable of handling a high-frequency signal having a frequency equal to or higher than, for example, 50 MHz. In order to obtain such a high-frequency signal from the PLL frequency synthesizer, it is necessary to form the prescaler 3 with bipolar transistors. It should be noted that the prescaler 3 including bipolar transistors consumes energy even when it does not receive any signal since current continuously flows through the bipolar transistors. In order to intermittently operate the prescaler 3 including bipolar transistors, it is necessary to completely cut off current passing through the bipolar transistors.

However, this has a disadvantage in that data stored in an internal latch of the prescaler 3 is destroyed because the current passing through the bipolar transistors is temporarily cut off. As a result, the signal which is output by the prescaler 3 in the initial state has a frequency which varies greatly. Even if the counters 2 and 4 and the phase comparator 5 start to operate in response to the in-phase detection signal, the phase comparator 5 compares the signals having varying frequencies. Hence, even though the phases of the signals input to the phase comparator 5 are initially coincident with each other, it becomes impossible to accurately execute the phase comparing operation after the initial state. As a result, the PLL frequency synthesizer has an unstable state, and it takes a long time to lock the phase of the PLL frequency synthesizer.

When the prescaler 3 is released from the current cutoff state, all current sources of the bipolar circuit of the prescaler 3 start to operate, and thus voltages at nodes of the prescaler 3 vary. This causes ringings to occur in the voltage waveforms.

SUMMARY OF THE INVENTION

It is a general object of the present invention to provide an improved PLL frequency synthesizer in which the above disadvantages are eliminated.

A more specific object of the present invention is to provide a PLL frequency synthesizer in which its intermittent operation can be stably carried out even when the prescaler is composed of bipolar transistors.

The above objects of the present invention are achieved by a PLL frequency synthesizer comprising: an oscillator generating a first oscillation signal; reference counter means, coupled to the oscillator, for generating a reference signal by frequency-dividing the first oscillation signal; a voltage-controlled oscillator generating a second oscillation signal; prescaler means, coupled to the voltage-controlled oscillator, for generating a first frequency-divided signal by frequency-dividing the second oscillation signal; programmable counter means, coupled to the prescaler means, for generating a second frequency-divided signal by frequency-dividing the first frequency-divided signal; phase comparator means, coupled to the reference counter means and the programmable counter means, for detecting a phase difference between the reference signal the second frequency-divided signal and for outputting a voltage signal based on the phase difference to the voltage controlled oscillator; initial phase detection means, coupled to the prescaler means and the oscillator, for detecting a state where an edge of the first frequency-divided signal and an edge of the first oscillation signal are within a predetermined time range and for outputting a detection signal to the programmable counter means, the reference counter means and the phase comparator means when the state is detected, the programmable counter means, the reference counter means and the phase comparator means starting to operate in response to the detection signal; reset means, coupled to the oscillator and the prescaler means, for determining whether or not the oscillator starts to normally generate the first oscillation signal in response to a predetermined external signal which intermittently operates the oscillator in a standby mode and for outputting a reset signal to the prescaler when it is determined that the oscillator normally generates the first oscillation signal; and hold means, coupled to the prescaler means and the initial phase detection means, for preventing the first frequency-divided signal from being output to the programmable counter means and the initial phase detection means until the prescaler means is reset to an initial state in response to the reset signal and starts to normally generate the first frequency-divided signal.

BRIEF DESCRIPTION OF THE DRAWINGS

Other objects, features and advantages of the present invention will become more apparent when read in conjunction with the accompanying drawings, in which.

DESCRIPTION OF THE PREFERRED EMBODIMENT

Figure 4:
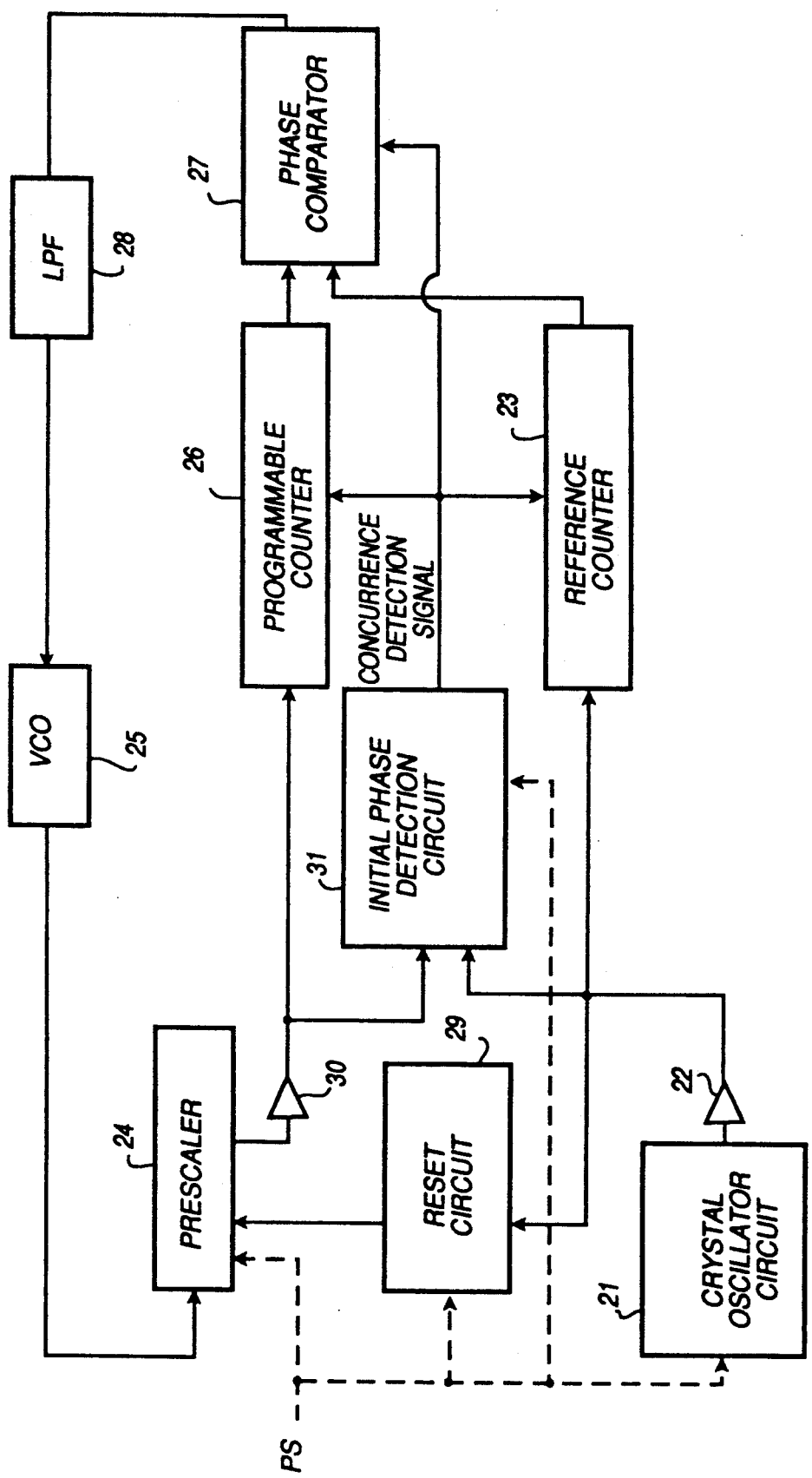
FIG. 4 is a block diagram of a preferred embodiment of the present invention.

Referring to FIG. 4, a crystal oscillator circuit 21 generates an oscillation signal having a basic frequency, which is input to a reference counter 23 via a buffer circuit 22. The aforementioned power save signal PS is input to the crystal oscillator circuit 21, so that it executes an intermittently oscillating operation. The reference counter 23 is composed of CMOS transistors, and frequency-divides the oscillation signal at a predetermined frequency dividing ratio. A frequency-divided signal is output as a reference signal. When the reference counter 23 receives a no-signal having a frequency of zero, it does not receive the oscillation signal having a frequency higher than zero until an in-phase signal generated by an initial phase detection circuit 31 is received.

A prescaler 24 is composed of bipolar transistors, and frequency-divides a signal generated by a voltage-controlled oscillator 25 at a predetermined frequency dividing ratio. A frequency-divided signal from the prescaler 24 is output to a programmable counter 26. The prescaler 24 receives the power save signal PS, and is intermittently supplied with electricity in response to the power save signal PS. During the operation, current intermittently flows through the bipolar transistors.

The programmable counter 26, composed of CMOS transistors, frequency-divides the frequency-divided signal from the prescaler 24 at a predetermined frequency dividing ratio. A frequency-divided signal from the programmable counter 26 is output as a compared signal. Further, the programmable counter 26 does not receive a signal having a frequency higher than zero from the prescaler 24 until the in-phase signal generated by the initial phase detection circuit 31 is received.

A phase comparator 27 compares the phase of the reference signal with the phase of the compared signal, and outputs a voltage signal based on the phase difference to the voltage-controlled oscillator 25 via a lowpass filter 28. The voltage-controlled oscillator 25 generates a signal having a frequency based on the voltage signal from the phase comparator 27 via the lowpass filter 28. After the frequencies of the reference signal and the compared signal become zero, the phase comparator 27 does not receive the reference signal having a frequency higher than zero and the compared signal having a frequency higher than zero until the in-phase detection signal generated by the initial phase detection circuit 31 is received.

A reset circuit 29 inputs the signal generated by the crystal oscillator circuit 21 via a buffer circuit 22. The reset circuit 29 detects a state where that the crystal oscillator circuit 21 has started to oscillate normally, and outputs a reset signal to the prescaler 24. The reset circuit 29 receives the power save signal PS, and operates intermittently.

A no-signal hold circuit 30 cuts off the output signal of the prescaler 24 until the initial setting operation on the prescaler 24 is executed and the prescaler 24 starts the stable operation. In this case, the output terminal of the no-signal hold circuit 30 is maintained in a no-signal state. After the prescaler 24 starts the stable operation, the no-signal hold circuit 30 passes the output signal of the prescaler 24.

When the power save signal PS turns OFF, a phase comparison/detection circuit 31 inputs the signals from the prescaler 24 and the crystal oscillator circuit 21, and determines whether or not the signal from the prescaler 24 rises at almost the same time as the signal from the oscillation signal from the crystal oscillator circuit 21 rises. When the signals rise concurrently, the phase comparison/detection circuit 31 outputs a concurrence detection signal to the counters 23 and 24, and the phase comparator 27.

In the state where the entire system is in the standby mode in which the PLL frequency synthesizer is intermittently supplied with the power save signal PS, the power save signal PS is output to the crystal oscillator circuit 21, the prescaler 24, the reset circuit 29 and the initial phase detection circuit 31. These structural elements stop operating each time the power save signal PS switches to the low level, and start to operate each time the power save signal PS switches to the high level.

The crystal oscillator circuit 21 stops operating each time the power save signal PS switches to the low level. At this time, the reference counter 23 receives a no-signal which is a signal having a frequency of zero. Since the reference counter 23 is composed of CMOS transistors as has been described previously, the level inverting operation of a CMOS inverter is not carried out, so that the reference signal output by the reference counter 23 becomes a no-signal which is a signal having a frequency of zero. During this time, energy is not consumed in the reference counter 23.

The supply of current to the prescaler 24 is stopped, and thus the prescaler 24 generates a no-signal, which is input to the programmable counter 26. Since the programmable counter 26 includes CMOS transistors, it does not the level inverting operation and does not consume energy. In this state, the compared signal output by the programmable counter 26 is a no-signal which is a signal having a frequency of zero.

Since the phase comparator 27 includes CMOS transistors, it does not consume energy when receiving the no-signals from the counters 23 and 26. In addition, the signal output to the lowpass filter 28 by the phase comparator 27 when the no-signals from the counters 23 and 26 are input thereto is in the high-impedance state. Thus, the PLL frequency synthesizer is maintained in a pseudo-lock state. During the time the power save signal is OFF (that is, maintained at the low level), the voltage-controlled oscillator 25 continues to oscillate based on the output signal from the phase comparator 27. In the pseudo-lock state, the crystal oscillator circuit 21, the counters 23 and 26, the prescaler 24 and the phase comparator 27 do not consume energy.

When the power save signal PS turns OFF and the crystal oscillator circuit 21, the prescaler 24, the reset circuit 29 and the initial phase detection circuit 31 start to operate, the reset circuit 29 determines that the crystal oscillator circuit 21 normally generates its oscillation signal, and outputs the reset signal to the prescaler 24, which is then initialized. After the prescaler 24 is initialized in response to the reset signal, the no-signal hold circuit 30 outputs the signal from the prescaler 24 to the programmable counter 26 and the initial phase detection circuit 31.

Hence, the initial phase detection circuit 31 can detect the rise concurrence on the basis of the stable signals output by the crystal oscillator circuit 21 and the prescaler 24. When the initial phase detection circuit 31 detects the rise concurrence and generates the concurrence detection signal, the reference counter 23, the programmable counter 26 and the phase comparator 27 start to receive the respective stable input signals and start to operate. Hence, the intermittent operation for saving energy consumed in the PLL frequency synthesizer can be stably performed.

Figure 1:
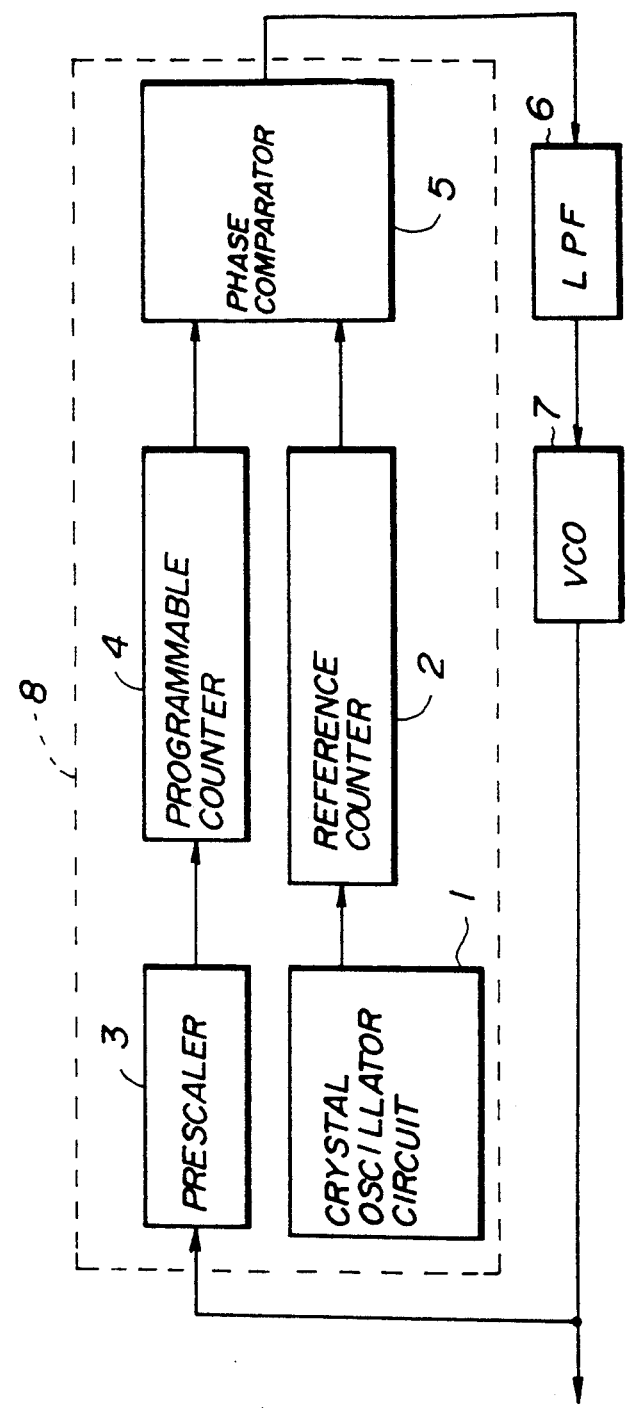
FIG. 1 is a block diagram of a conventional PLL frequency synthesizer.
Figure 2:
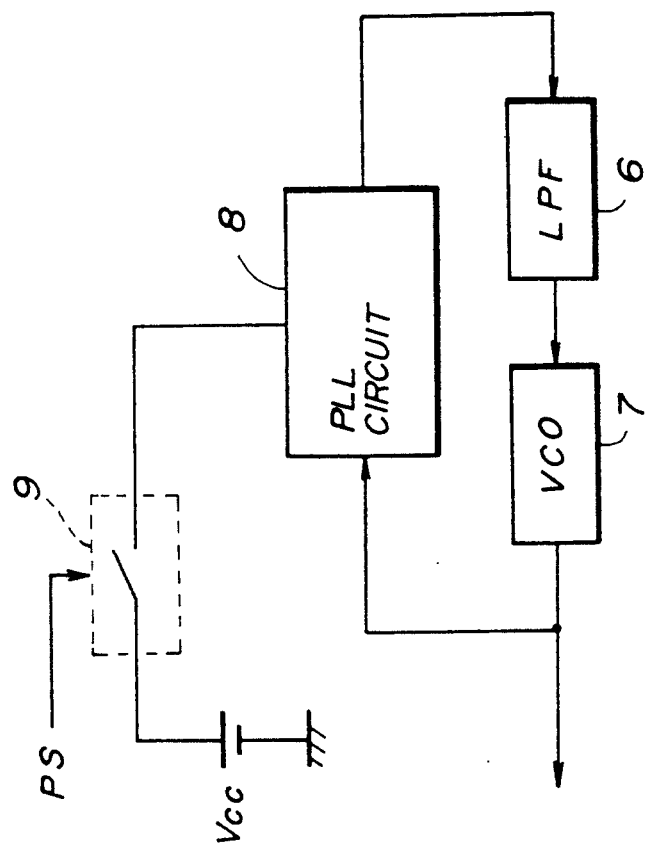
FIG. 2 is a block diagram showing an intermittent operation of the PLL frequency synthesizer shown in FIG. 1.
Figure 3:
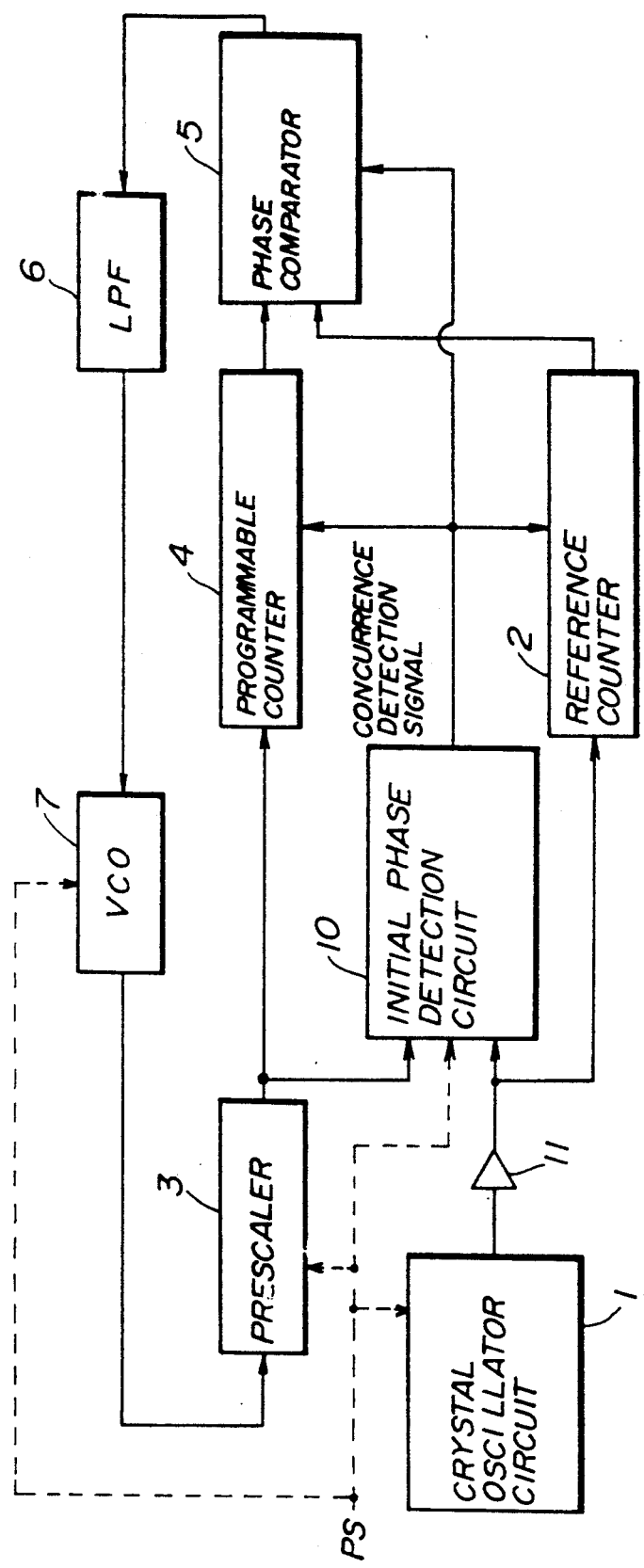
FIG. 3 is a block diagram of a conventional improved PLL frequency synthesizer.
Figure 5:
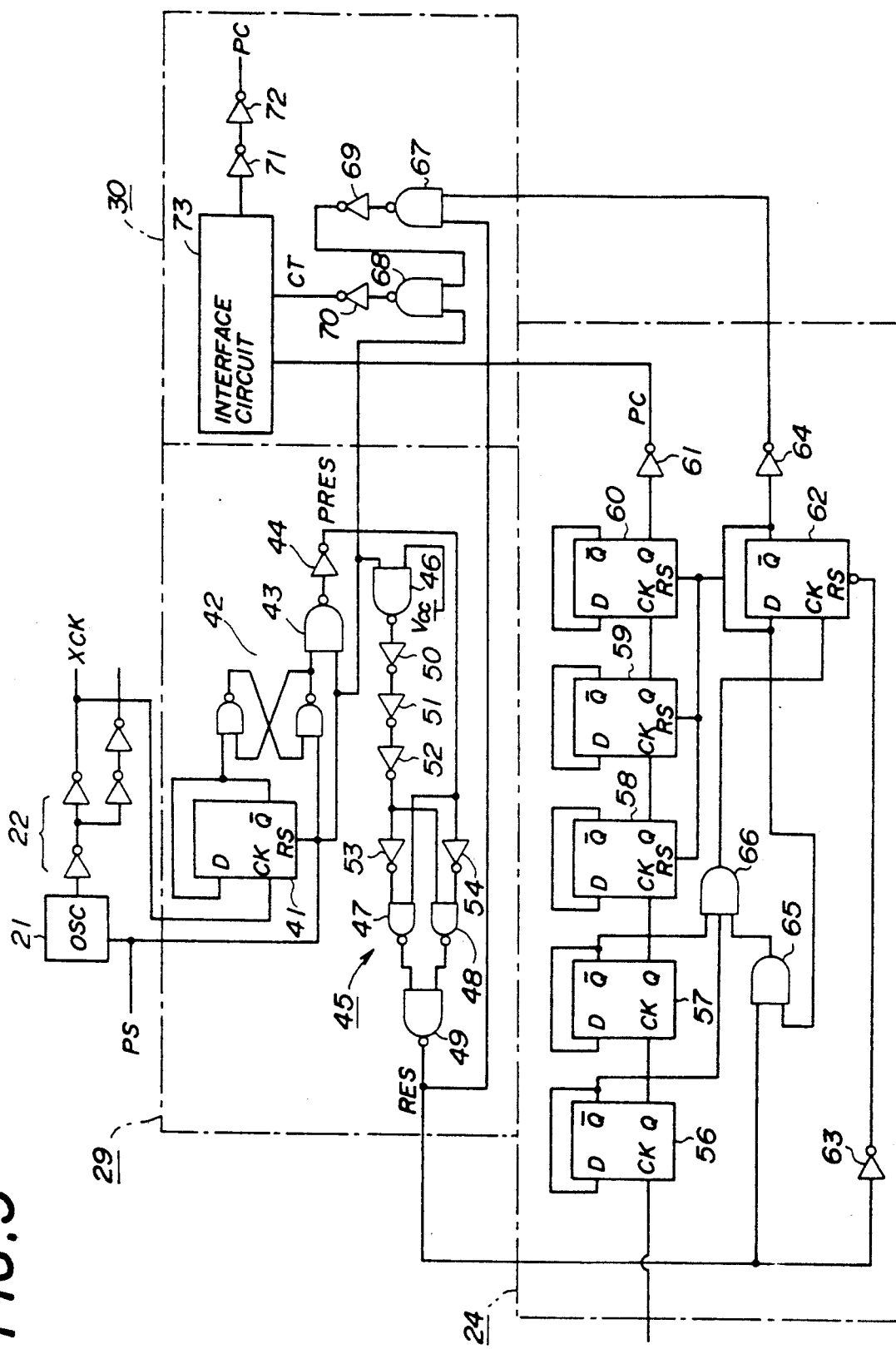
FIG. 5 is a circuit diagram of essential parts of the preferred embodiment of the present invention shown in FIG. 4.
Figure 6:
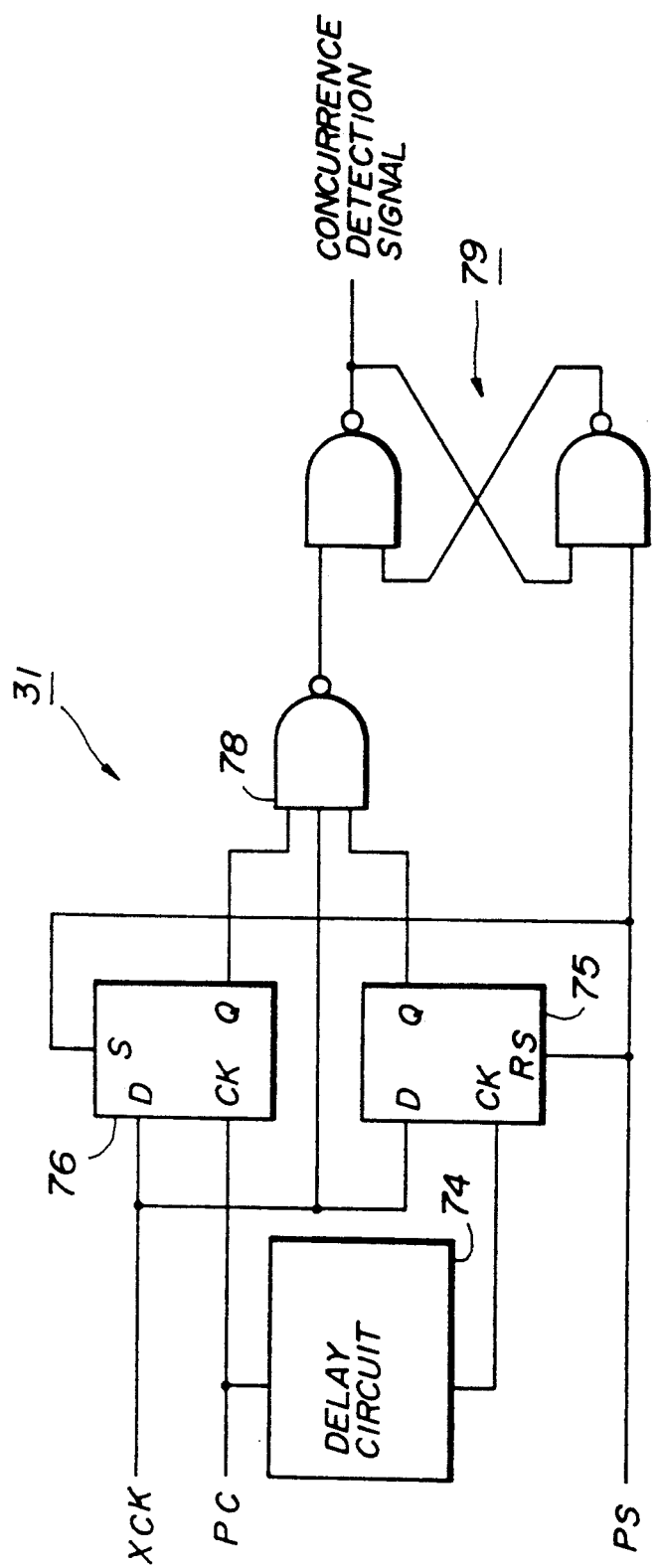
FIG. 6 is a block diagram of an initial phase detection circuit used in the circuit shown in FIG. 5.

FIG. 5 is a circuit diagram of the prescaler 24, the reset circuit 29 and the buffer 30 shown in FIG. 4, and FIG. 6 is a circuit diagram of the initial phase detection circuit 31 shown in FIG. 4. The reference counter 23, the programmable counter 26, the phase comparator 27, the lowpass filter 28 and the voltage-controlled oscillator 25 are the same as those shown in FIGS. 1 and 2.

Referring to FIG.5, the crystal oscillator circuit 21 is supplied with the power save signal PS. When the power save signal PS is at the low level (ON), the crystal oscillator circuit 21 stops oscillating. When the power save signal PS is at the high level (OFF), the crystal oscillator circuit 21 starts to oscillate. The oscillation signal, labeled XCK, of the crystal oscillator circuit 21 passes through the buffer circuit 22 composed of two inverters, and is output to the reset circuit 29, the initial phase detection circuit 31 and the reference counter 23 including CMOS transistors.

The reset circuit 29 has a D-type flip-flop (hereafter simply referred to as FF) 41, which has a reset terminal RS receiving the power save signal PS and a clock input terminal CK receiving the oscillation signal XCK. Further, the FF 41 has an output terminal /Q (Q bar) and a data input terminal D, which are mutually connected. The FF 41 is reset and the output terminal /Q is switched to a high level when the power save signal PS switches to OFF. In this state, when the first oscillation signal XCK is input to the clock input terminal CK, the output terminal /Q switches to a low level.

The output terminal /Q of the FF 41 is connected to one of two input terminals of an FF 42 composed of two NAND circuits. The other input terminal of the FF 42 is supplied with the power save signal PS. The output signal of the FF 42 switches to the low level when the output terminal /Q of the FF 41 switches to the low level in response to the first input of the oscillation signal XCK. This state of the FF 42 is maintained until the power save signal PS turns ON even when the FF 41 operates in response to the oscillation signal XCK.

In this manner, the FFs 41 and 42 has the function of determining whether or not the crystal oscillator circuit 21 starts the normal (stable) oscillation operation after the power save signal PS turns OFF. The output signal of the FF 42 is input to one of two input terminals of a NAND circuit 43, the other input terminal of which receives the power save signal PS. The output signal of the NAND circuit 43 is output, as a preset signal PRES, via a NOT circuit 44. The present signal PRES is output to a reset signal generation circuit 45.

The reset signal generation circuit 45 is composed of four NAND circuits 46–49 and five NOT circuits 50–54. The preset signal PRES is input to the NAND circuit 47, and input to the NAND circuit 48 via the NOT circuit 54.

The NAND circuit 46 and the NOT circuits 50–52 form a delay circuit, which outputs the power save signal PS to the AND circuit 48, and outputs the power save signal PS to the NAND circuit 47 via the NOT circuit 53. In this manner, the power save signal PS is delayed and then input to the NAND circuits 47 and 48. The delay time of the delay circuit is determined so that when the power save signal PS switches to the high level (OFF) from the low level (ON), the high level of the power save signal PS is input to the NAND circuits 47 and 48 at the same time as the preset signal PRES switches from the low level to the high level.

When the power save signal PS switches to the high level (OFF), the low-level signal is applied to one of the two input terminals 47, and the high-level signal is applied to the other input terminal 48 thereof. In this state, when the preset signal PRES becomes the high level, the output signals of the NAND circuits 47 and 48 switch to the high level. As a result, the reset signal RES output by the NAND circuit 49 is maintained at the low level. When the preset signal PRES switches to the low level from the high level, the output signal of the NAND circuit 47 is maintained at the high level, and the output signal of the NAND circuit 48 switches to the low level. Hence, the reset signal RES output by the NAND circuit 49 is inverted to the high level from the low level.

That is, when the power save signal PS switches OFF, the reset circuit 29 generates the reset signal RES which rises from the low level to the high level when it determines that the crystal oscillator circuit 21 generates the first and normal oscillation signal SCK. The reset signal RES is output to the prescaler 24.

The prescaler 24 is composed of a frequency-divider composed of five FFs 56–60 and a NOT circuit 61, and a reset detection circuit composed of an FF 62, NOT circuits 63 and 64, and AND circuits 65 and 66. These circuits are formed with bipolar transistors in order to handle a high-frequency signal.

The FFs 56–60 are connected in series. The output signal of the voltage-controlled oscillator 25 is applied to a clock input terminal CK of the FF 56 in the first stage. The FF 60 in the final stage generates, via its output terminal /Q, an output signal obtained by frequency-dividing the output signal of the voltage-controlled oscillator 25.

The FF 62 has a reset input terminal coupled to the reset circuit 29 via the NOT circuit 63. When the reset signal RES switches to the high level, the FF 62 is reset. The output terminal /Q of the FF 62 is connected to its data input terminal D and reset terminals RS of the FFs 58, 59 and 60. When the reset signal RES switches to the high level, the output terminal /Q of the FF 62 switches to the high level, which resets the FFs 58, 59 and 60.

The AND circuit 65 receives the reset signal RES and the output signal of the FF circuit 62. When the AND circuit 65 receives the high-level signal from the FF 62 after receiving the reset signal FES, the output signal of the AND circuit 65 switches to the high level, which is applied to the AND circuit 66. The AND circuit 66 receives the output signals of the FFs 56 and 57. When both the output signals of the FFs 56 and 57 switch to the high level after the output signal of the AND circuit 65 switches to the high level, the AND circuit 66 outputs a high-level signal to the clock input terminal of the FF 62. In response to the high-level signal from the AND circuit 66, the output terminal /Q of the FF 62 switches to the low level, and is maintained at the low level until the next reset signal RES is input. The low-level signal via the output terminal /Q of the FF 62 is input to the no-signal hold circuit 30 via the NOT circuit 64.

That is, the reset detection circuit of the prescaler 24 resets the three high-order FFs 58–60, and detects the state where the two low-order FFs 56 and 57 are in the reset state in response to the output signal of the voltage-controlled oscillator 25. At this time, the reset detection circuit of the prescaler 24 determines that all the FFs 56–60 are in the reset state, and outputs a signal to the no-signal hold circuit 30.

The no-signal hold circuit 30 is composed of two NAND circuits 67 and 68, four NOT circuits 69–72, and an interface circuit 73. The NAND circuit in the first stage receives the output signal of the reset detection circuit of the prescaler 24 and the reset signal RES. When the no-signal hold circuit 30 receives the high-level output signal of the reset detection circuit of the prescaler 24 after receiving the reset signal maintained at the high level, it outputs a high-level signal to the NAND circuit 68 via the NOT circuit 69.

When the NAND circuit 68 receives the power save signal PS maintained at the high level (OFF) via one of the two input terminals, and receives the high-level signal via the other input terminal, it outputs a control signal CT maintained at the high level to the interface circuit 73 via the NOT circuit 70. When the power save signal PS is ON (at the low level), the reset signal RES is still at the low level, or the output signal of the reset detection circuit of the prescaler 24 is at the low level, the control signal maintained at the low level is output to the interface circuit 73.

The interface circuit 73 has an input terminal connected to the frequency-dividing circuit of the prescaler 24, and an output terminal coupled to the programmable counter 26 and the initial phase detection circuit 31 via the NOT circuits 71 and 72, respectively. When the control signal CT is at the low level, the interface circuit 73 cuts off the frequency-divided signal PC from the prescaler 24, and sets its output terminal to the no-signal state in which a signal having a frequency of zero is output via the output terminal of the interface circuit 73. When the control signal CT is at the high level, the interface circuit 73 passes the frequency-divided signal fro the prescaler 24, and outputs it to the programmable counter 26 and the initial phase detection circuit 31.

That is, the no-signal hold circuit 30 switches to the no-signal state when the power save signal PS is ON (at the low level), and maintains the no-signal state until all the FFs 56-60 are completely reset and start to operate normally after the power save signal PS switches to OFF. When the FFs 56-60 starts to generate the normal frequency-divided signal PC, the no-signal hold circuit 30 outputs the signal PC to the programmable counter 26 and the initial phase detection circuit 31.

As shown in FIG. 6, the initial phase detection circuit 31 is composed of a delay circuit 74, two FFs 75 and 76, a NAND circuit 78, and an FF 79 composed of two NAND circuits.

The FF 75 has a reset input terminal RS receiving the power save signal PS, and a clock input terminal CK receiving the frequency-divided signal PC transferred via the delay circuit 74. Further, the FF 75 has a data input terminal D receiving the oscillation signal XCK generated by the crystal oscillator circuit 21. The FF 76 has a set input terminal S receiving the power save signal PS, and a clock input terminal CK receiving the frequency-divided signal PC. Further, the FF 76 has a data input terminal D receiving the oscillation signal XCK.

The FF 75 switches to the reset state when its output terminal Q changes to the low level in response to the switching of the power save signal PS from OFF to ON, and outputs, via its output terminal Q, the state of the frequency-divided signal PC obtained at this time in response to the rise of the oscillation signal XCK.

The FF 76 switches to the set state when its output terminal /Q changes to the low level in response to the switching of the power save signal PS from OFF to ON, and outputs, via its output terminal /Q, an inverted version of the state of the frequency-divided signal PC obtained at this time in response to the rise of the oscillation signal XCK.

That is, when the power save signal PS is ON, the power supply to the crystal oscillator circuit 21 and the prescaler 24 is stopped, and thus the oscillation signal SCK and the frequency-divided signal PC have the no-signal state where the frequencies thereof are zero. Thus, the FFs 75 and 76 do not operate. Even when the power save signal PS switches to ON and the oscillation signal XCK is input to the data input terminals of the FFs 75 and 76, the FFs 75 and 76 do not operate because the frequency-divided signal PC is not output.

When the no-signal hold circuit 31 starts to output the frequency-divided signal PC, the FFs 75 and 76 start to operate in synchronism with the frequency-divided signal PC. At this time, the FF 75 receives the frequency-divided signal via the delay circuit 74, the operation starting time of the FF 76 lags behind that of the FF 76 by the delay time of the delay circuit 74. That is, the FF 75 detects the state of the oscillation signal XCK which occurs slightly later than the FF 76 detects the state thereof.

Thus, when the frequency-divided signal PC rises and the oscillation signal XCK is at the low level, the output signal obtained at the output terminal /Q of the FF 76 is at the high level. Thus, the FF 76 waits for the next rise of the frequency-divided signal PC. At this time, the FF 75 has not yet received the rise of the frequency-divided signal PC due to the function of the delay circuit 74. The FF 75 generates the high-level output signal and waits for the next rise of the frequency-divided signal PC when the frequency-divided signal receives the frequency-divided signal PC in the state where the oscillation signal XCK switches to the high level before the elapse of the delay time of the delay circuit 74 and is maintained at the high level, in other words, in the state where the rise timing of the oscillation signal XCK and the rise timing of the frequency-divided signal PC are close to each other so that the difference between the rise timings thereof is shorter than the delay time of the delay circuit 74.

The NAND circuit 78 receives the output signals from the FFs 75 and 76 and the oscillation signal XCK. The NAND circuit 78 outputs the low-level signal to the FF 79, when the output signals from the FFs 75 and 76 and the oscillation signal XCK are at the high level, that is, when the oscillation signal XCK rises at almost the same time as the frequency-divided signal PC rises.

The power save signal PS is input to the other input terminal of the FF 79, which outputs the low-level signal when the power save signal PS switches to ON. The NAND circuit 78 changes its state and outputs the high-level signal to the reference counter 23, the programmable counter 26 and the phase comparator 27 when the power save signal PS switches to OFF and then the NAND circuit 78 switches to the high level. The concurrence detection signal at the high level is maintained until the power save signal PS turns OFF.

Figure 7:
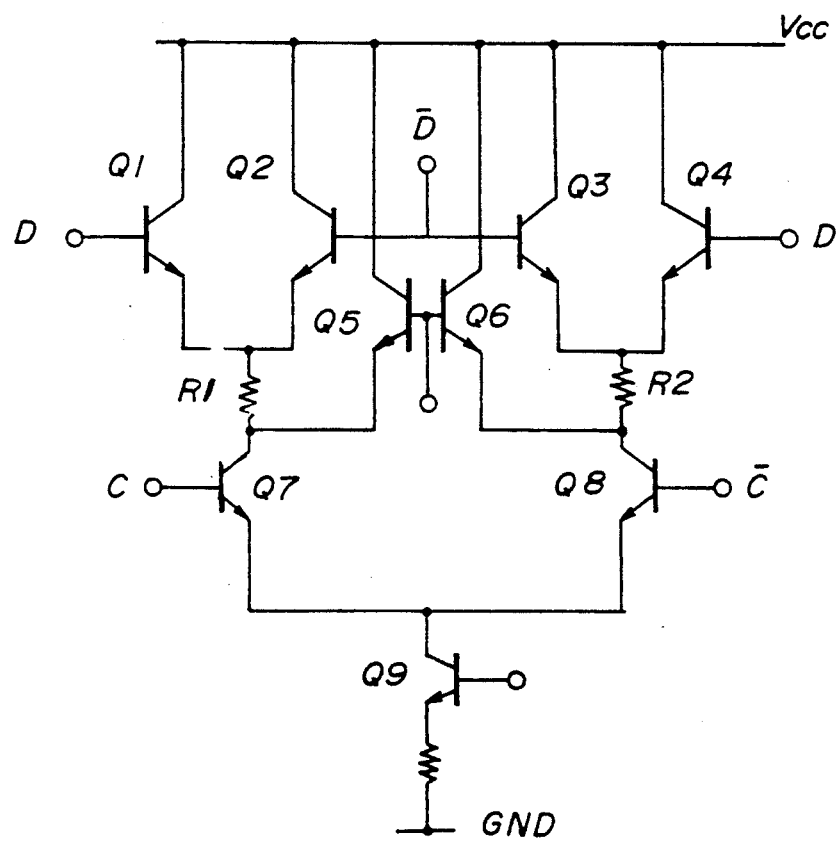
FIG. 7 is a block diagram of a D-type flip flop of bipolar-transistor type used in a prescaler shown in FIG. 5.

FIG. 7 is a circuit diagram of each D-type flip-flop used in the prescaler 24. As shown, the D-type flip-flop is composed of bipolar transistors Q1-Q9 and resistors R1 and R2.

Figure 8:
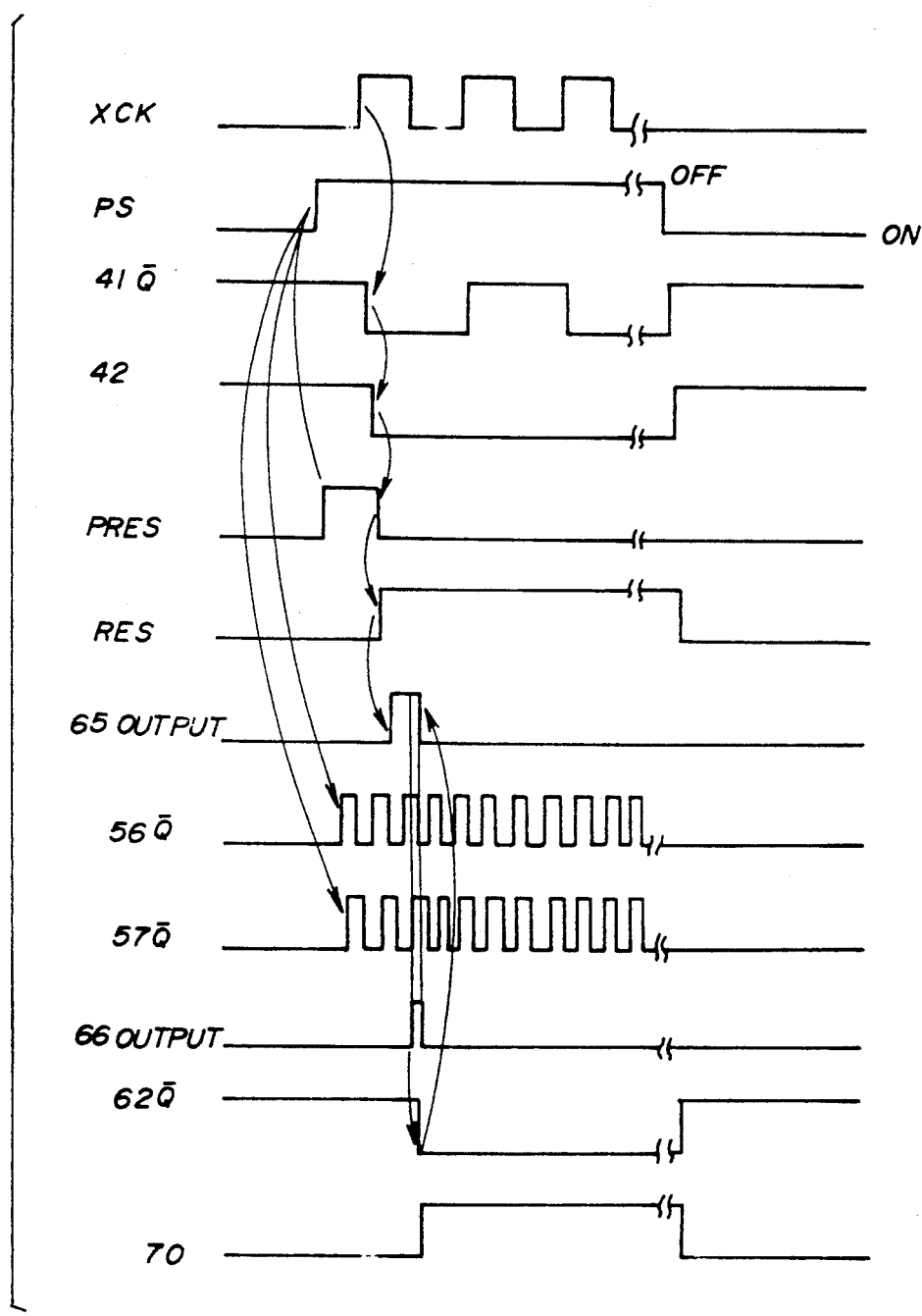
FIG. 8 is a timing chart showing the operation of the preferred embodiment of the present invention.

A description will now be given of the operation of the above-mentioned PLL frequency synthesizer with reference to FIG. 8.

When the power save signal PS turns ON in the standby mode where the power save signal PS alternately turns ON and OFF, the crystal oscillator 21, the prescaler 24, the reset circuit 29 and the initial phase detection circuit 31 are cut off. At this time, the crystal oscillator circuit 21 stops oscillating and switches to the no-signal state. Similarly, the prescaler 24 switches to the no-signal state, and the no-signal hold circuit 30 switches to the no-signal state. Thus, the programmable counter 26 receiving the frequency-divided signal PC and the reference counter 23 receiving the oscillation signal XCK do not operate. since the counters 23 and 26 are formed of CMOS transistors, the reference signal and the compared signal applied to the phase comparator 27 become the no-signals.

Since the phase comparator 27 is composed of CMOS transistors and receives no-signals from the counters 23 and 26, it does not consume energy. During this operation, the value of the phase comparator 27 which is output to the lowpass filter 28 when the no-signals are applied to the phase comparator 27 is maintained in the high-impedance state, so that the PLL frequency synthesizer is maintained in the pseudo-lock state. During the time the power save signal PS is ON, the voltage-controlled oscillator 25 continues to oscillate by using the value output by the phase comparator 27.

When the power save signal PS turns OFF, the crystal oscillator circuit 21, the prescaler 24, the reset circuit 29 and the initial phase detection circuit 31 start to operate. When the crystal oscillator circuit 21 starts to operate and generates the first oscillation signal XCK, the reset circuit 29 recognizes that the crystal oscillator circuit 21 operates normally, and generates the reset signal having the high level. During this operation, the low-level signal is input to the NAND circuit 67 of the no-signal hold circuit 30, the frequency-divided signal generated by the prescaler 24, which already starts to operate in the state where the initial setting has not yet been established, is interrupted by the no-signal hold circuit 30. Thus, the frequency-divided signal PC which has unstable frequency components is not input to the initial phase detection circuit 31. Thus, the detection of the rise timings of the frequency-divided signal PC and the oscillation signal XCK is not carried out. Hence, the initial phase detection circuit 31 does not generate the concurrence detection signal. Although the reference counter 23 is supplied with the oscillation signal XCK, the counters 23 and 26 and the phase comparator 27 do not start to operate because the the counter 23 is still in the cutoff state.

When the FFs 56–60 of the prescaler 23 are reset in response to the high-level reset signal RES, the high-level signal is input to the NAND circuit 67 of the no-signal hold circuit 30, so that the no-signal hold circuit 30 passes the frequency-divided signal PC from the prescaler 23.

The initial phase detection circuit 31 starts to detect the rise timings of the oscillation signal XCK and the frequency-divided signal after the initial setting has been executed. When the initial phase detection circuit 31 recognizes that the oscillation signal XCK rises at almost the same time as the frequency-divided signal PC, it outputs the concurrence detection signal to the counters 23 and 26 and the phase comparator 27. In response to the concurrence detection signal, the counters 23 and 26 frequency-divide the oscillation signal XCK and the frequency-divided signal PC at the respective frequency-dividing ratios, and supply the respective output signals (the reference signal and compared signal) to the phase comparator 27. The phase comparator 27 compares the phase of the reference signal with the phase of the compared signal, and outputs the voltage signal having a magnitude dependent on the phase difference.

In the above-mentioned manner, it becomes possible to rest the reference counter 23, the program counter 26 and the phase comparator 27 by simply stopping intermittently operation of the crystal oscillator circuit 21, the prescaler 24, the reset circuit 29 and the initial phase detection circuit 31. Hence, it is possible to save energy consumed in the PLL frequency synthesizer. Further, it does not take a long time to pull the PLL frequency synthesizer in the locked state because the signals respectively latched in the reference counter 23 and the program counter 26 are not destroyed.

The frequency-divided signal PC input to the initial phase detection circuit 31 has been subjected to the initial setting procedure. With this arrangement, it becomes possible to accurately detect the phase difference between the rise timing of the stable frequency-divided signal PC and the rise timing of the oscillation signal XCK. In addition, it becomes possible to detect the phase difference immediately after the power supply is turned ON, so that the intermittent operation on power saving can be stably executed immediately after the power supply is turned ON.

The present invention is not limited to the specifically disclosed embodiment, and various variations and modifications may be made within the scope of the present invention.

What is claimed is:

1. A PLL frequency synthesizer comprising:
   an oscillator generating a first oscillation signal;
   reference counter means, coupled to said oscillator, for generating a reference signal by frequency-dividing the first oscillation signal;
   a voltage-controlled oscillator generating a second oscillation signal;
   prescaler means, coupled to said voltage-controlled oscillator, for generating a first frequency-divided signal by frequency-dividing the second oscillation signal;
   programmable counter means, coupled to said prescaler means, for generating a second frequency-divided signal by frequency-dividing the first frequency-divided signal;
   phase comparator means, coupled to said reference counter means and said programmable counter means, for detecting a phase difference between the reference signal the second frequency-divided signal and for outputting a voltage signal based on the phase difference to the voltage controlled oscillator;
   initial phase detection means, coupled to said prescaler means and said oscillator, for detecting a state where an edge of the first frequency-divided signal and an edge of the first oscillation signal are within a predetermined time range and for outputting a detection signal to said programmable counter means, said reference counter means and said phase comparator means when said state is detected, said programmable counter means, said reference counter means and said phase comparator means starting to operate in response to said detection signal;
   reset means, coupled to said oscillator and said prescaler means, for determining whether or not said oscillator starts to normally generate the first oscillation signal in response to a predetermined external signal which intermittently operates said oscillator in a standby mode and for outputting a reset signal to said prescaler when it is determined that said oscillator normally generates the first oscillation signal; and
   hold means, coupled to said prescaler means and said initial phase detection means, for preventing the first frequency-divided signal from being output to said programmable counter means and said initial phase detection means until said prescaler means is reset to an initial state in response to said reset signal and starts to normally generate said first frequency-divided signal.

2. A PLL frequency synthesizer as claimed in claim 1, wherein said hold means comprises means for outputting a signal having a frequency of zero to said programmable counter means and said initial phase detection means until said prescaler means is reset to the initial state in response to said reset signal and starts to normally generate said first frequency-divided signal.

3. A PLL frequency synthesizer as claimed in claim 1, wherein said hold means comprises means for passing the first frequency-divided signal to said programmable counter means and said initial phase detection means after said prescaler means is reset to the initial state in response to said reset signal and starts to normally generate said first frequency-divided signal.

4. A PLL frequency synthesizer as claimed in claim 1, wherein said prescaler means comprises a bipolar transistor circuit.

5. A PLL frequency synthesizer as claimed in claim 1, wherein:
   said programmable counter means comprises a CMOS transistor type programmable counter;
   said reference counter means comprises a CMOS transistor type reference counter; and
   said initial phase detection means comprises a CMOS transistor type initial phase detection circuit.

6. A PLL frequency synthesizer as claimed in claim 1, wherein said reset means comprises flip-flop means for changing a state of the flip-flop means in response to a first pulse signal of said first oscillation signal after said flip-flop means is reset in response to said predetermined external signal.

7. A PLL frequency synthesizer as claimed in claim 1, wherein said predetermined external signal is a power save signal.

* * * * *

UNITED STATES PATENT AND TRADEMARK OFFICE
CERTIFICATE OF CORRECTION

PATENT NO. : 5,180,992
DATED : January 19, 1993
INVENTOR(S) : Akiyama et al

It is certified that error appears in the above-indentified patent and that said Letters Patent is hereby corrected as shown below:

On the title page, Item [73]:

Assignee:, "Fujitsu Limited, Japan"
should be --Fujitsu Limited, Japan, and
Fujitsu VLSI Limited, Japan--.

Signed and Sealed this

Tenth Day of May, 1994

Attest:

BRUCE LEHMAN

*Attesting Officer*  Commissioner of Patents and Trademarks